United States Patent
Takahashi et al.

(10) Patent No.: US 7,235,418 B2
(45) Date of Patent: Jun. 26, 2007

(54) MANUFACTURING METHOD OF OPTICAL SEMICONDUCTOR INTEGRATED CIRCUIT DEVICE

(75) Inventors: Tsuyoshi Takahashi, Gunma (JP); Katsuya Okabe, Gunma (JP); Akira Hatsugai, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 270 days.

(21) Appl. No.: 10/949,707

(22) Filed: Sep. 27, 2004

(65) Prior Publication Data
US 2005/0106767 A1    May 19, 2005

(30) Foreign Application Priority Data
Sep. 29, 2003    (JP)    ............... 2003-338856

(51) Int. Cl.
*H01L 21/00*    (2006.01)
(52) U.S. Cl. .......................................... 438/69; 438/72
(58) Field of Classification Search ................. 438/29, 438/57, 69, 72; 257/83, 436, 437
See application file for complete search history.

(56) References Cited

U.S. PATENT DOCUMENTS 6,433,366 B1 * 8/2002 Takimoto et al. ............. 257/83
6,846,694 B2 * 1/2005 Natsuaki et al. ............. 438/57

FOREIGN PATENT DOCUMENTS

| JP | 3-206671 | 9/1991 |
| JP | 2001-320078 | 11/2001 |
| JP | 2003-224253 | 8/2003 |

* cited by examiner

*Primary Examiner*—Kevin M. Picardat
(74) *Attorney, Agent, or Firm*—Morris & Foerster LLP

(57) ABSTRACT

In an existing optical semiconductor integrated circuit device, a multi-layered wiring layer is formed on a top surface of a substrate. Therefore, a film thickness of an insulating layer on a top surface of a photodiode could be uniformed with difficulty. Thus there was a problem in the constitution of the insulating layer wherein light incidence was caused to fluctuate, and thereby a desired sensitivity to light could not be obtained. In an optical semiconductor integrated circuit device according to the present invention, after a multi-layered wiring layer is formed on a top surface of a substrate, an insulating layer on a top surface of an anti-reflection film of a photodiode is dry-etched to remove. At this time, a barrier metal layer is used as an etching stopper film. Thereby, in the invention, a manufacturing process can be simplified and owing to adoption of the dry etching miniaturization can be realized. Furthermore, since the anti-reflection film is exposed from the insulating layer, fluctuation of incident light can be suppressed and the sensitivity to light can be improved.

6 Claims, 4 Drawing Sheets

MANUFACTURING METHOD OF OPTICAL SEMICONDUCTOR INTEGRATED CIRCUIT DEVICE

BACKGROUND OF THE INVENTION

1. Field of the Invention

The present invention relates to a manufacturing method of an optical semiconductor integrated circuit device with a photodiode and intends to eliminate the variation of a film thickness of an insulating layer laminated on the photodiode and to improve the sensitivity of the photodiode.

2. Description of the Related Art

An optical semiconductor integrated circuit device that is formed monolithic by integrating a photodetector and a periphery circuit is different from one in which a photodetector and a circuit element are separately prepared and formed into a hybrid IC. In an optical semiconductor device, cost reduction can be expected. Furthermore, the optical semiconductor device is advantageous in that it is resistant against noise due to an external electromagnetic field.

In an existing optical semiconductor device with a built-in photodiode, for instance, an impurity is diffused on a surface of an N-type substrate to form a P-type semiconductor layer. Subsequently, outside of the neighborhood of a portion where a PN junction is exposed on a surface, a $SiO_2$ film and a $SiO_3N_4$ film are alternately stacked three layers each to form a highly reflective film. On the other hand, in the surroundings of a light-receiving portion, over an entire surface except for a contact hole that brings a P-type semiconductor layer and a P-type electrode into contact, a $SiO_3N_4$ film is formed to form a photodiode (patent literature 1).

Furthermore, in an existing optical semiconductor device with a built-in photodiode, for instance, on a P-type substrate a non-doped first epitaxial layer and an N-type second epitaxial layer are laminated. In island regions partitioned with isolation regions, a photodiode, a capacitor element and an NPN transistor are formed respectively. In a photodiode formation region, on a surface of the second epitaxial layer, a surface protective film is formed. At this time, a silicon oxide film, a polyimide base interlayer insulating film and a jacket coat on a surface protective film are removed (patent literature 2).

[Patent literature 1] JP-A No. 03-206671 (page 2 and FIG. 1)

[Patent literature 2] JP-A No. 2001-320078 (pages 3 to 5 and FIG. 1)

As mentioned above, in the patent literature 1, on an N-type substrate, only a photodiode element is formed. In addition, even on a surface of the substrate, a single layer wiring structure is formed and an anti-reflection film is exposed.

However, for instance, in an optical semiconductor integrated circuit device having a built-in photodiode, on a surface of a semiconductor layer on which a photodiode element and so on are formed, a multi-layered wiring layer is formed. In the optical semiconductor integrated circuit device, owing to the wiring layer, the respective elements are electrically connected. Accordingly, the respective layers are necessary to be insulated from each other, and, as the insulating layer, a silicon oxide film and BPSG (Boron Phospho Silicate Glass) film made of an inorganic material or a polyimide film made of an organic material are used. When a wiring layer is formed in each of the respective layers, a flatness of the insulating layer is maintained by use of an SOG (Spin On Glass) film or the like.

That is, in the existing optical semiconductor integrated circuit device, owing to the formation of a multi-layered wiring layer, the variation is caused in a film thickness of the insulating layer. In particular, on the photodiode formation region, owing to the variation of the insulating layer, the reflectance is different depending on a position where light enters. As a result, there is a problem in that the fluctuation in the sensitivity of a photodiode is caused accordingly.

On the other hand, in the patent literature 2, in the optical semiconductor integrated circuit device with a built-in photodiode, on a photodiode formation region, only a single layer film of a silicon nitride film is coated as a surface protective film.

However, in the invention in patent literature 2, the silicon nitride film is used as an etching stopper film when the insulating film is wet-etched. By use of wet etching, the insulating film is removed. Accordingly, when the insulating film is removed owing to the wet etching, the etching proceeds in a horizontal direction to a surface of the substrate. As a result, in wet etching, it is difficult to etch into a desired structure, resulting in causing a problem in that the processing accuracy is poor.

Furthermore, when wet etching is used to remove, the etching rates in a horizontal direction and in a depth direction are substantially same. Accordingly, in wet etching, a miniaturization process is applied with difficulty; that is, there is a problem in that wet etching cannot cope with recent super high integration.

SUMMARY OF THE INVENTION

The present invention is achieved in view of the above-mentioned various circumstances. A manufacturing method according to the present invention of an optical semiconductor integrated circuit device comprises preparing a semiconductor substrate, forming a semiconductor layer in which at least one layer of epitaxial layer is laminated on the semiconductor substrate, and forming a photodiode on the semiconductor layer; after a silicon nitride film is formed on a surface of the semiconductor layer in a formation region of the photodiode, forming a barrier metal layer on the silicon nitride film; laminating an insulating layer on a top surface of the semiconductor layer and removing, from a surface of the insulating layer, by means of dry etching, the insulating layer in the formation region of the photodiode; and removing the barrier metal layer and thereby exposing the silicon nitride film. Accordingly, in the manufacturing method according to the invention of an optical semiconductor integrated circuit device, when an insulating layer formed on a photodiode formation region is removed, dry etching is used to remove the insulating layer. Thereby, the processing accuracy owing to the etching can be improved and a miniaturization process can be realized.

According to the manufacturing method according to the present invention of an optical semiconductor integrated circuit device, in the process of removing the insulating layer, the barrier metal layer is used as an etching stopper layer and dry etching is used to remove the insulating layer. Accordingly, in the manufacturing method according to the present invention of an optical semiconductor integrated circuit device, when the insulating layer formed on the photodiode formation region is removed, the barrier metal layer is used as an etching stopper layer. Thereby, in the invention, the insulating layer on the photodiode formation region can be removed by means of dry etching.

According to the manufacturing method according to the present invention of an optical semiconductor integrated circuit device, in the process of removing the barrier metal layer, the silicon nitride film is used as an etching stopper layer and wet etching is applied to remove the barrier metal layer. Accordingly, in the manufacturing method according to the present invention of an optical semiconductor integrated circuit device, the barrier metal layer that is used as an etching stopper layer at dry etching is removed by means of wet etching. Thereby, on a top surface of the photodiode, only a silicon nitride film as an anti-reflection film can be disposed.

According to the manufacturing method according to the present invention of an optical semiconductor integrated circuit device, when an insulating layer formed on a top surface of an anti-reflection film of the photodiode is removed, dry etching can be used to remove. That is, in the invention, a barrier metal layer on a top surface of a silicon nitride film is used as an etching stopper film of dry etching. Accordingly, in the invention, the processing accuracy of an element can be improved and thereby a microfabrication process can be realized.

In the manufacturing method according to the present invention of an optical semiconductor integrated circuit device, a barrier metal layer is formed on a top surface of a silicon nitride film that is an anti-reflection film of a photodiode. The barrier metal layer is used as an etching stopper film in wet etching. Accordingly, in the photodiode according to the invention, the silicon nitride film that is an anti-reflection film is not over-etched. As a result, in the invention, a film thickness of the anti-reflection film can be inhibited from fluctuating. By the use of such the anti-reflection film, an improvement in the sensitivity of incident light can be realized and a microfabrication structure can be realized.

In the manufacturing method according to the present invention of an optical semiconductor integrated circuit device, when an insulating layer deposited on a top surface of the photodiode is removed owing to dry etching, a barrier metal layer is used as an etching stopper film. The barrier metal layer, when forming a first wiring layer, is simultaneously formed. Accordingly, in the invention, since the forming a barrier metal layer can be performed concurrently with the forming a wiring and an electrode, simplification of a manufacturing method can be realized.

DESCRIPTION OF THE PREFERRED EMBODIMENTS

In what follows, an optical semiconductor integrated circuit device according to one embodiment of the invention will be detailed with reference to FIG. 1.

Figure 1:
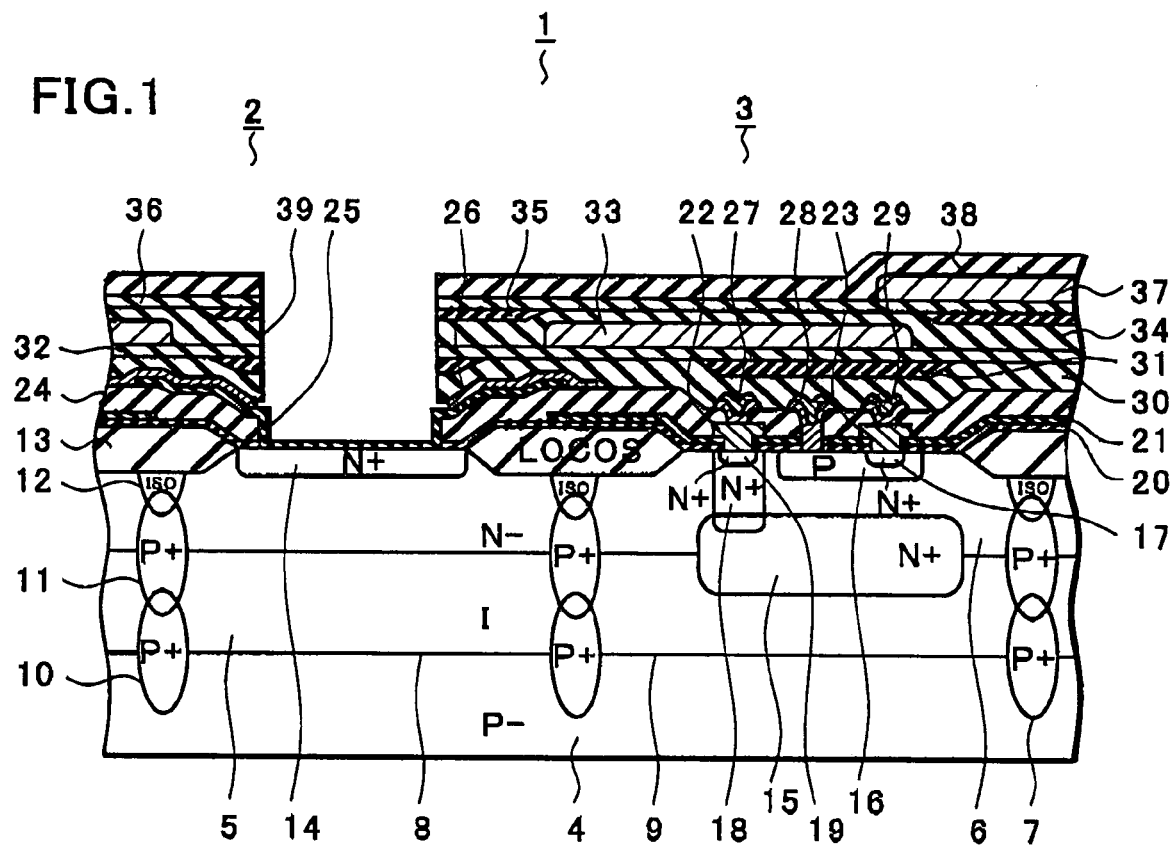
FIG. 1 is a sectional view for explaining an optical semiconductor integrated circuit device according to an embodiment of the present invention.

FIG. 1 is a sectional view of an optical semiconductor integrated circuit device 1 in which a photodiode 2 and an NPN transistor 3 are assembled in one embodiment of the invention. In FIG. 1, only a photodiode 2 and an NPN transistor 3 are shown. However, other than these, various elements such as a capacitor element and a vertical PNP transistor are assembled, and thereby an optical semiconductor integrated circuit device is formed.

As shown in FIG. 1, in an optical semiconductor integrated circuit device according to the embodiment, on a P-type single crystal silicon substrate 4, a first epitaxial layer 5 that has, for instance, the resistivity of 200 Ω·cm or more and a thickness of 10.0 to 20.0 μm and is laminated without doping is formed. On the first epitaxial layer 5, an N-type second epitaxial layer 6 that has, for instance, the resistivity of substantially 0.5 to 3.0 Ω·cm and a thickness of 4.0 to 7.0 μm and is laminated doped with phosphorus (P) is formed. In the substrate 4, the first epitaxial layer 5 and the second epitaxial layer 6, with P-type isolation regions 7 that penetrate through the above three, a first island region 8 and a second island region 9 are formed.

The isolation region 7 includes a first isolation region 10 diffused in an up and down direction from a surface of the substrate 4, a second isolation region 11 diffused in an up and down direction from a surface of the first epitaxial layer 5 and a third isolation region 12 diffused from a surface of the second epitaxial layer 6. When these three are linked, the first and second epitaxial layers 5 and 6 are isolated island-like. Furthermore, on the P-type isolation region 7, a LOCOS oxide film 13 is formed. Thereby, the element isolation is more forwarded. Here, the LOCOS oxide film 13 can be replaced with a simply thick insulating film.

In the embodiment, in the first island region 8 a photodiode 2 is formed and in the second island region 9 an NPN transistor 3 is formed. On top surfaces of the second epitaxial layer 6 and the LOCOS oxide film 13, a silicon oxide film 20 and a silicon nitride film 21 are deposited. On a top surface of the silicon nitride film 21 a BPSG (Boron Phospho Silicate Glass) film 24 is formed. On a top surface of the BPSG film 24, for instance, according to a sputtering method, a barrier metal layer 26 and an Al layer are deposited. In the same manner, the barrier metal layer 26 and the Al layer are deposited in a contact hole formed in the BPSG film 24. The barrier metal layer 26 and the Al layer are formed as a first wiring layer, and electrodes 27, 28 and 29 of the NPN transistor. In the embodiment, when on a bottom surface of the first wiring layer a BPSG film 24 is formed and heat treatment is applied in a reflow process, the flatness of the insulating layer can be improved.

Since the optical semiconductor integrated circuit device according to the embodiment is formed in a multi-layered wiring layer structure, on a top surface of a first wiring layer and so on, TEOS (Tetra-Ethyl-Ortho-Silicate) films 30 and 32 and an SOG (Spin On Glass) film 31 are deposited. When the SOG film 31 is formed between the TEOS films 30 and 32, the TEOS film 30 formed with irregularities owing to the first wiring layer is flattened. On a top surface of the SOG film 31, the TEOS film 32 is formed with definite flatness maintained. Thereafter, on a top surface of the TEOS film 32, a second wiring layer 33, TEOS films 34 and 36, an SOG film 35 and a third wiring layer 37 are formed. According to the embodiment, it is formed into a three-layered wiring layer structure; accordingly, on a top surface of the third wiring layer 37, with an intention of improving the humidity resistance, a silicon nitride film 38 is deposited by, for instance, means of a plasma CVD method.

According to the embodiment, though detailed later, the insulating layer on the top surface of the formation region of the photodiode 2 is removed, and on the top surface of the formation region of the photodiode 2 an opening 39 is formed. From a bottom surface of the opening 39, the silicon nitride film 25 is exposed and works as an anti-reflection film of the photodiode 2.

According to the embodiment, an optical semiconductor integrated circuit device is formed into a three-layered wiring structure; however, there is no need of restricting to the embodiment. For instance, an n-layered wiring (n indicates a natural number such as 1, 2 - - - .) structure such as a four-layered wiring structure and a five-layered wiring structure can be formed.

In what follows, the photodiode 2 and the NPN transistor 3 each will be explained of a structure thereof.

Firstly, a photodiode 2 that is formed in the first island region 8 will be explained. In the embodiment, as shown in FIG. 1, in the second epitaxial layer 6 that is separated by the LOCOS oxide film 13, an N-type diffusion region 14 is formed over a substantially entire surface. As mentioned above, the first epitaxial layer 5 is formed without doping and the second epitaxial layer 6 is formed doped with phosphorus. In this structure, the N-type diffusion region 14 is used as a cathode region.

Furthermore, in the embodiment, on a surface of the N-type diffusion region 14, a silicon nitride layer 25 that covers a bottom surface of an opening 39 formed in the insulating layer is formed. Though not shown in the sectional view in FIG. 1, to the N-type diffusion region 14 a cathode electrode is connected. On the other hand, as mentioned above, the substrate 4 is a P-type single crystal silicon substrate and is linked with the P-type isolation region 7. Though not shown in the sectional view in FIG. 1, on a surface of the isolation region 7 an anode electrode is formed and the substrate 4 is used as an anode region. The isolation region 7 plays a role of an anode extraction region.

An operation of the photodiode 2 is as explained below. For instance, a VCC potential such as +5 V is applied to a cathode electrode of the photodiode 2 and a GND potential is applied to an anode electrode. Then, the photodiode 2 is made a state in which a reverse bias is applied thereto. At this time, in the photodiode 2, as mentioned above, the first epitaxial layer 5 is formed without doping and thereby can secure a depleted layer formation region larger in width. That is, a substantially entire region of the first epitaxial layer 5 that is formed without doping can be made a depleted layer formation region. Since when the photodiode 2 is in a reverse-biased state a depleted layer can be formed wider, a drift speed of carriers generated by light incidence can be improved. As a result, high-speed response of the photodiode 2 is enabled.

In the photodiode 2 according to the embodiment, as mentioned above, on a surface of the second epitaxial layer 6 partitioned with the LOCOS oxide film 13 the N-type diffusion region 14 is formed over a substantially entire surface. On a surface of the N-type diffusion region 14, over a substantially entire surface (A region where a cathode electrode is formed is excluded.) thereof, the silicon nitride film 25 is formed as an anti-reflection film. In the embodiment, the silicon nitride film 25 is formed with a thickness of, for instance, substantially 400 to 1000 Å.

In the next place, the NPN transistor 3 formed in the second island region 9 will be explained. As shown in FIG. 1, in the embodiment, an N-type buried layer 15 is formed so as to sandwich a boundary between the first epitaxial layer 5 and the second epitaxial layer 6. In the second epitaxial layer 6, a P-type diffusion region 16 as a base region, an N-type seepage region 17 as an emitter region and an N-type diffusion region 18 as a collector region are formed. Furthermore, in the N-type diffusion region 18, an N-type seepage region 19 as a collector extraction region is formed.

Furthermore, in the embodiment, with polysilicon to which an N-type impurity is ion-planted, a collector extraction electrode 22 and an emitter extraction electrode 23 are formed. As mentioned above, owing to seepage of the N-type impurity that is ion-planted in the polysilicon, an N-type collector extraction region and an emitter extraction region are formed. On top surfaces of the collector extraction electrode 22 and the emitter extraction electrode 23, the BPSG film 24 is formed. Through contact holes formed in the BPSG film 24, a collector electrode 27, a base electrode 28 and an emitter electrode 29 are formed.

The collector electrode 27, the base electrode 28 and the emitter electrode 29 are formed with a lamination structure of the barrier metal layer and aluminum (Al). The barrier metal layer of the collector electrode 27 and the emitter electrode 29, respectively, are connected to the collector extraction electrode 22 and the emitter extraction electrode 23 that are made of polysilicon. That is, in the embodiment, when the first wiring layer and an electrode are formed, a two-layered structure of a barrier metal layer and an Al layer is formed. Thereby, with the barrier metal layer, Al spike can be inhibited from occurring. Other than the above, within a range that does not deviate from a gist of the embodiment of the invention, various modifications can be applied.

In the next place, with reference to FIGS. 2 through 6, a method of manufacturing an optical semiconductor integrated circuit device in which a photodiode 2 and an NPN transistor 3 according to the abovementioned embodiment are assembled will be explained below. In the explanation below, constitutional elements same as that explained in the optical semiconductor integrated circuit device shown in FIG. 1 are given the same reference numerals.

Figure 2:
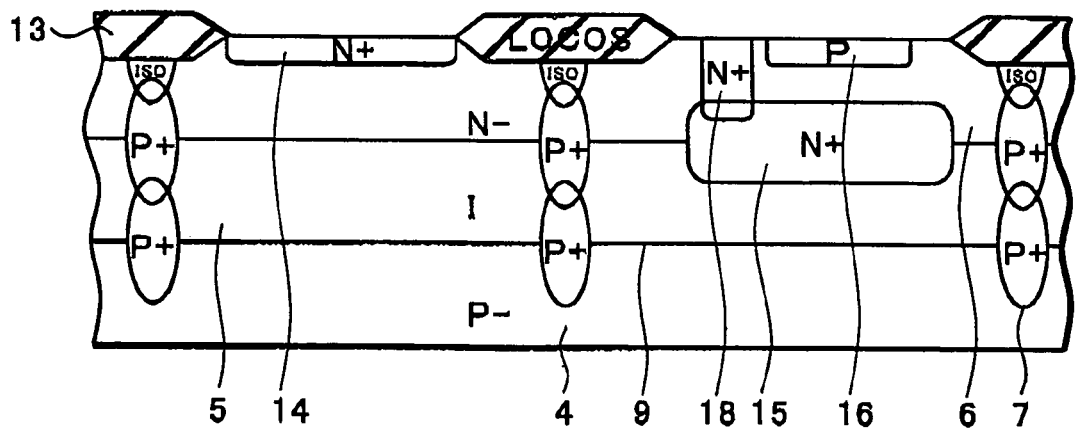
FIG. 2 is a sectional view for explaining a manufacturing method of an optical semiconductor integrated circuit device according to an embodiment of the present invention.

Firstly, as shown in FIG. 2, a P-type single crystal silicon substrate 4 is prepared, on a top surface of the substrate 4 a non-doped first epitaxial layer 5 and an N-type second epitaxial layer 6 are laminated. While the first epitaxial layer 5 and the second epitaxial layer 6 are laminated, for instance, according to known photolithography technique, an isolation region 7, an N-type diffusion region 14 of a photodiode 2, an N-type buried layer 15 of an NPN transistor 3, a P-type diffusion region 16 and an N-type diffusion region 18 are formed as needed. Furthermore, as shown in FIG. 2, a LOCOS oxide film 13 is formed in a desired region of the second epitaxial layer 6. In particular, when the LOCOS oxide film 13 is formed on the isolation region 7, the element isolation can be more forwarded. Here, the LOCOS oxide film 13 is formed with a thickness of, for instance, substantially 0.5 to 1.0 μm.

Figure 3:
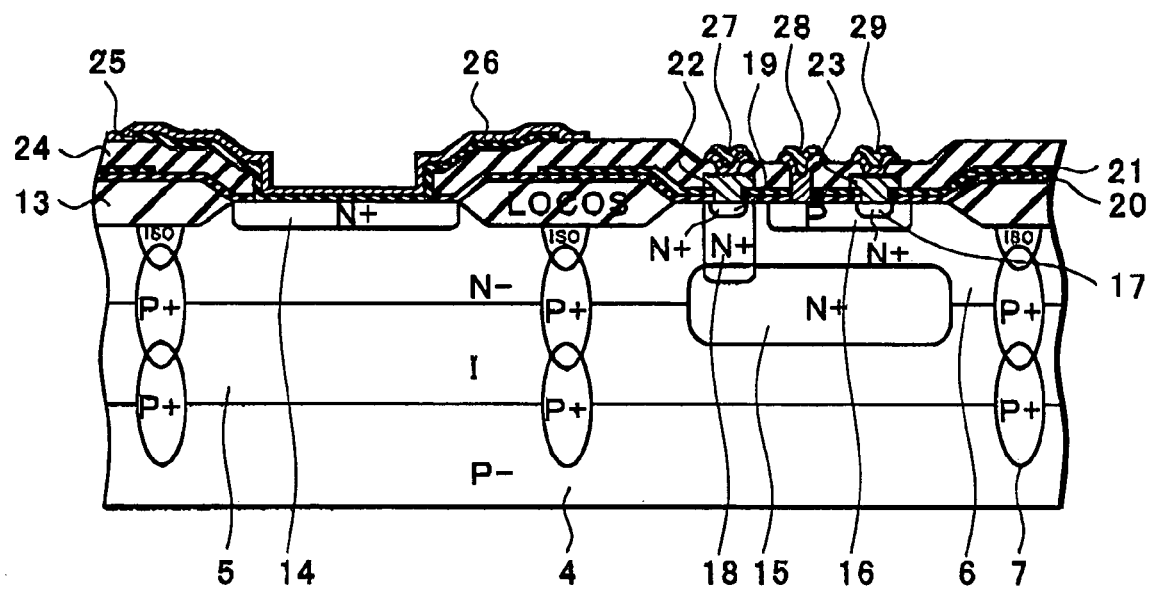
FIG. 3 is a sectional view for explaining a manufacturing method of an optical semiconductor integrated circuit device according to an embodiment of the present invention.

In the next place, as shown in FIG. 3, on a surface of the second epitaxial layer 6, a silicon oxide film 20 and a silicon nitride film 21 are formed. Subsequently, in a formation region of the photodiode 2 and in a formation region of the NPN transistor 3, for instance, by means of known photolithography technique, the silicon oxide film 20 and the silicon nitride film 21, respectively, are selectively removed. Thereafter, in the formation region of the NPN transistor 3, polysilicon in which, through a contact hole, an N-type impurity such as arsenic (As) is ion-planted is formed. The polysilicon becomes a collector extraction electrode 22 and an emitter extraction electrode 23. At this time, the N-type impurity injected into the polysilicon seeps to form N-type seepage regions 17 and 19.

Subsequently, on a substantially entire surface of a top surface of the second epitaxial layer 6, a BPSG film 24 is formed. The BPSG film 24 on a top surface of the N-type diffusion region 14, the collector extraction electrode 22 and the emitter extraction electrode 23 is selectively removed by means of, for instance, known photolithography technique. On a surface of the second epitaxial layer 6 in the formation region of photodiode 2, by means of a CVD method, for instance, at 800 degree centigrade and for substantially 2 hrs, a silicon nitride film 25 is formed with a thickness of substantially 400 to 1000 Å.

Subsequently, in the formation regions of the photodiode 2 and the NPN transistor 3, by means of a sputtering method, a barrier metal layer 26 and an Al layer are deposited. At this time, a titanium (Ti) layer of substantially 300 Å and a titanium nitride (TiN) layer of substantially 700 Å are laminated to form the barrier metal layer 26. In the embodiment, the barrier metal layer 26 and the Al layer are deposited, in the formation region of the photodiode 2, on a top surface of the silicon nitride film 25, and, in the formation region of the NPN transistor 3, as a collector electrode 27, a base electrode 28 and an emitter electrode 29. Other than the above, though not shown in the FIG. 3, the barrier metal layer 26 and the Al layer are deposited as a first wiring layer of the optical semiconductor integrated circuit device 1.

Thereafter, in the formation region of the photodiode 2, by use of, for instance, known photolithography technique, with the barrier metal layer 26 as an etching stopper film, the Al layer is removed according to wet etching. According to the process, on a top surface of the photodiode 2, the silicon nitride film 25 and the barrier metal layer 26 are formed.

Figure 4:
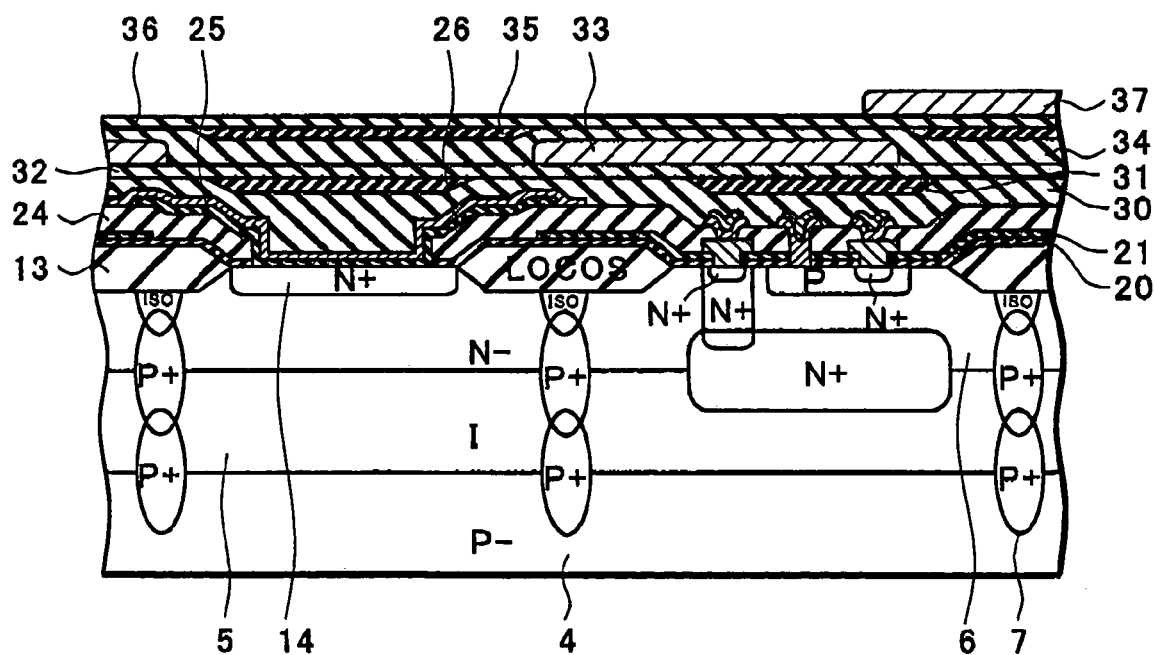
FIG. 4 is a sectional view for explaining a manufacturing method of an optical semiconductor integrated circuit device according to an embodiment of the present invention.

In the next place, as shown in FIG. 4, an interlayer insulating layer between a first wiring layer and a second wiring layer 33, an interlayer insulating layer between the second wiring layer 33 and a third wiring layer 37 and the third wiring layer 37 are formed. As the interlayer insulating layer, firstly, on a top surface of the barrier metal layer 26, the first wiring layer and so on, a TEOS film 30 is deposited. In the TEOS film 30, owing to the first wiring layer, a surface thereof is irregularly formed. In order to eliminate the irregularities and form a flat surface, a liquid SOG (Spin On Glass) is coated to form an SOG film 31. Thereafter, on the SOG film 31, a TEOS film 32 is deposited once more. In the embodiment, the SOG film 31 is formed between the TEOS films 30 and 32. Thus, owing to the SOG film 31, a top surface of the TEOS film 30 on which the irregularities are formed owing to the first wiring layer or the like is planarized. The TEOS film 32 is formed on a top surface of the SOG film 31 with the flatness thereof secured. As a result, the second wiring layer 33 is formed on a top surface of the TEOS film 32 of which flatness is more maintained. Thereby, the second wiring layer 33 can be inhibited from short-circuiting.

According to the abovementioned manufacturing method, on a top surface of the second wiring layer 33, a TEOS film 34, an SOG film 35, a TEOS film 36 and the third wiring layer 37 are formed.

Figure 5:
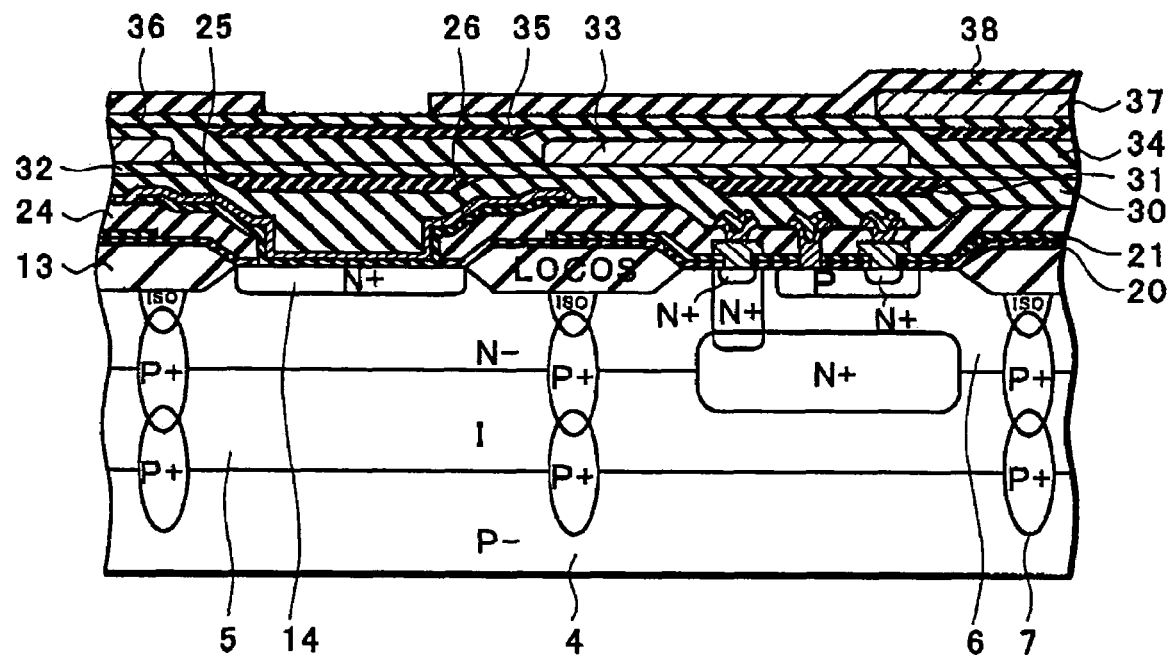
FIG. 5 is a sectional view for explaining a manufacturing method of an optical semiconductor integrated circuit device according to an embodiment of the present invention.

Subsequently, as shown in FIG. 5, on a top surface, that is, the upper-most layer of the third wiring layer 37, under depressurized state, at a formation temperature of 450 degree centigrade or less, according to a plasma CVD (Plasma-Enhanced Chemical Vapor Deposition) method, a silicon nitride film 38 is deposited over a substantially entire surface. Thereafter, the silicon nitride film 38 is selectively removed. In the embodiment, in a formation region of the photodiode 2, by means of, for instance, known photolithography technique, with, for instance, $CHF_3+O_2$ base gas, dry etching is applied. Thereby, interlayer insulating layers such as TEOS films 30, 32, 34 and 36 and SOG films 31 and 35 on a top surface of the barrier metal layer 26 are selectively removed.

At this time, in the embodiment, at least in the formation region of the photodiode 2, the interlayer insulating layers on a top surface of the barrier metal layer 26 are wholly removed by means of dry etching. That is, the gas is selected by considering the selectivity of the interlayer insulating layers such as the TEOS films and the barrier metal layer 26. Accordingly, the barrier metal layer 26 on a top surface of the formation region of the photodiode 2 is used as an etching stopper film in dry etching process. Thereby, the silicon nitride film 25 can be inhibited from being over-etched.

According to the embodiment, the interlayer insulating layers are removed by means of dry etching. At this time, dry etching may be applied one time to remove or a plurality of times to remove. Furthermore, in the embodiment, according to the plasma CVD method under the above conditions, the silicon nitride film 38 is formed, and thereby the wiring can be inhibited from deforming owing to heat.

Figure 6:
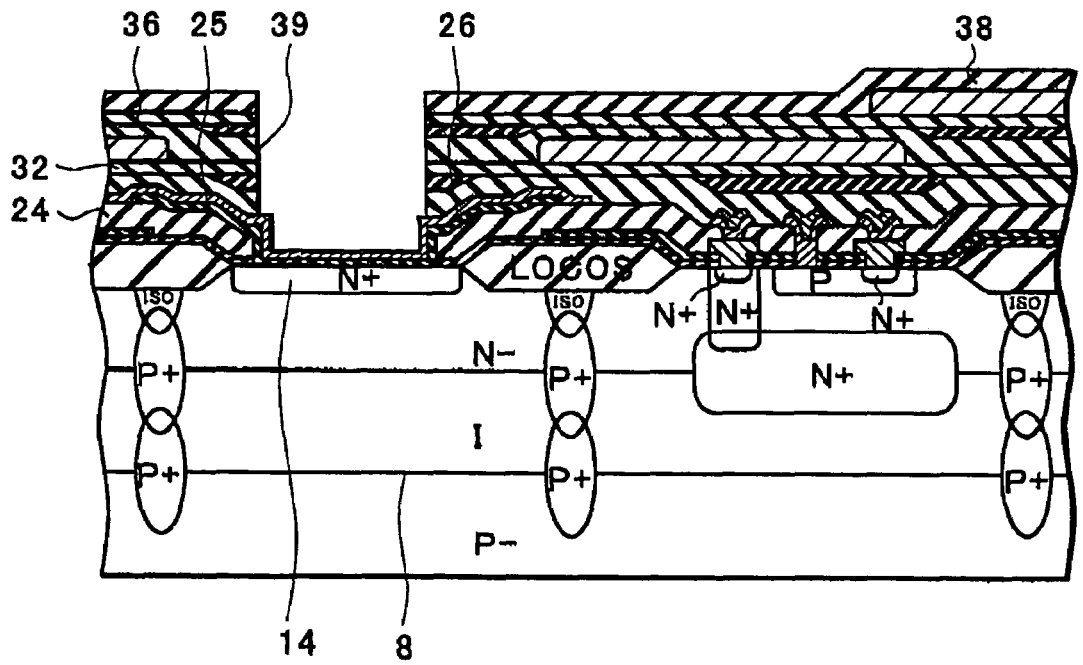
FIG. 6 is a sectional view for explaining a manufacturing method of an optical semiconductor integrated circuit device according to an embodiment of the present invention.

In the next place, as shown in FIG. 6, the barrier metal layer 26 exposed from an opening 39 on a top surface of the formation region of the photodiode 2 is removed. The silicon nitride film 25 that is used as an anti-reflection film is exposed from the opening 39. In the embodiment, in the formation region of the photodiode 2, for instance, by means of the known photolithography technique, wet etching is applied with an SC-1 base etchant. The etchant is selected considering the selectivity of the barrier metal layer 26 and the silicon nitride film 25. Thus, in the embodiment, with the silicon nitride film 25 as an etching stopper layer, the barrier metal layer 26 is selectively removed.

At this time, in the embodiment, the barrier metal layer 26 exposed from the opening 39 is removed. Accordingly, for instance, the barrier metal layer 26 formed on a top surface of the LOCOS oxide film 13 that surrounds the formation region of the photodiode 2 remains on a top surface of the silicon nitride film 25. However, since the remained barrier metal layer 26 is not exposed from the opening 39 and is not disposed on a top surface of an N-type diffusion region 14, there is no particular problem.

In the embodiment, when wet etching is applied with a $H_2O_2$ base etchant under heating, the barrier metal layer 26 can be removed as well.

According to the abovementioned manufacturing method, an optical semiconductor integrated circuit device 21 shown in FIG. 1 comes to completion. In the embodiment, an optical semiconductor integrated circuit device in which a photodiode and an NPN transistor are assembled is described. However, there is no need of restricting to this case. For instance, even in an IC in which a photodiode and a periphery circuit are assembled, an effect similar to that can be obtained. Other than the above, within a range that does not deviate from a gist of the embodiment of the invention, various modifications can be applied.

Figure 7:
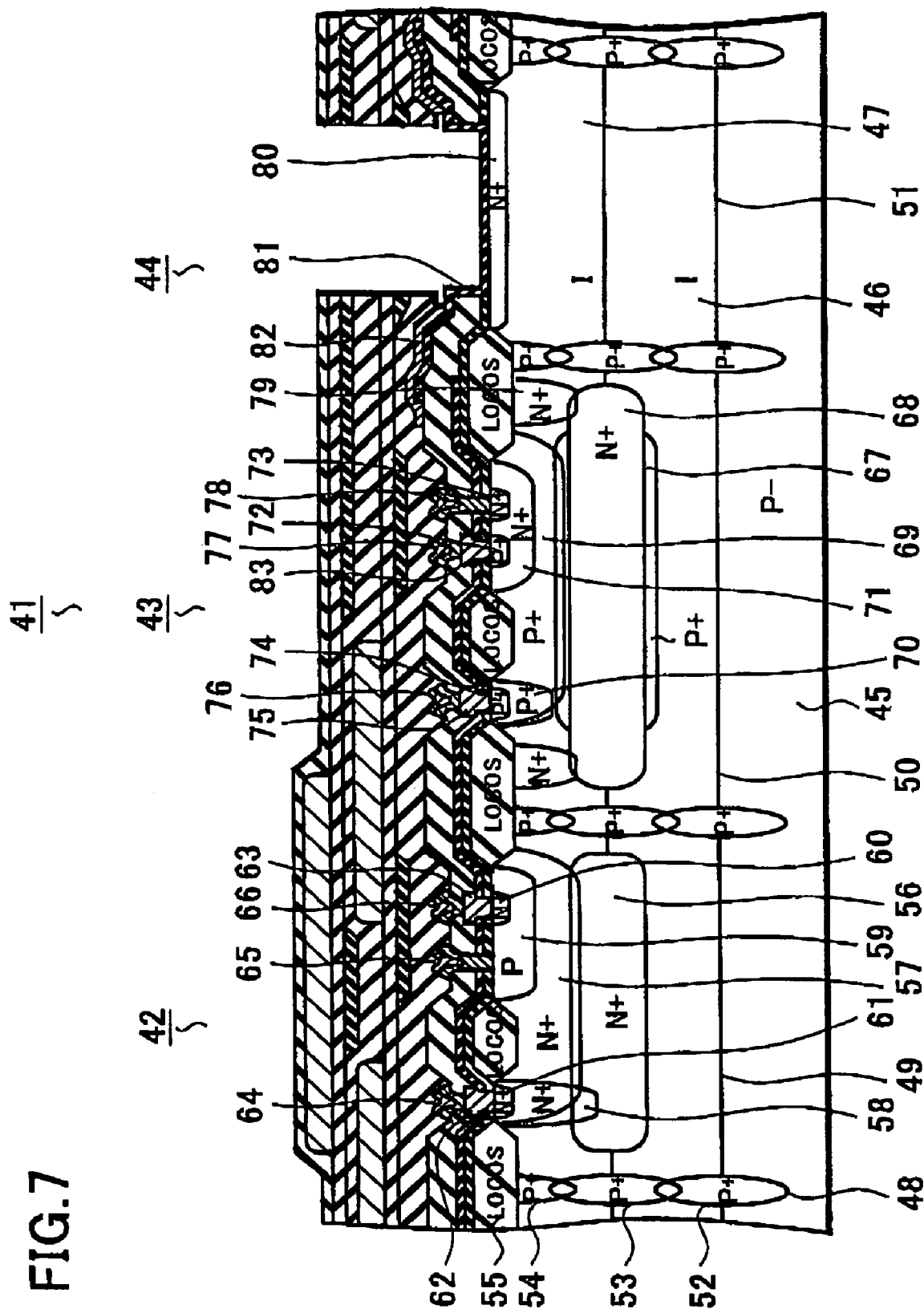
FIG. 7 is a sectional view for explaining an optical semiconductor integrated circuit device according to an embodiment of the present invention.

In the next place, FIG. 7 is a sectional view of another optical semiconductor integrated circuit device in the embodiment and shows an optical semiconductor integrated circuit device 41 in which an NPN transistor 42, a vertical PNP transistor 43 and a photodiode 44 are assembled.

As shown in FIG. 7, on a P-type single crystal silicon substrate 45, for instance, a first epitaxial layer 46 that has the resistivity of 100 Ω·cm or more and a thickness of 6.0 to 8.0 µm and is laminated without doping is formed. On the first epitaxial layer 46, for instance, a second epitaxial layer 47 that has the resistivity of substantially 100 Ω·cm or more and a thickness of 6.0 to 8.0 µm and is laminated without doping is formed. In the substrate 45, the first epitaxial layer 46 and the second epitaxial layer 47, with P-type isolation regions 48 that penetrate through the above three, a first island region 49, a second island region 50 and a third island; region 51 are formed.

The isolation region 48 includes a first isolation region 52 that is diffused in an up and down direction from a surface of the substrate 45, a second isolation region 53 that is diffused in an up and down direction from a surface of the first epitaxial layer 46 and a third isolation region 54 that is diffused from a surface of the second epitaxial layer 47. When the three are linked together, the first and second epitaxial layers 46 and 47 are separated island-like. Furthermore, when on the P-type isolation region 48 a LOCOS oxide film 55 is formed, element isolation can be more forwarded.

In the first island region 49 an NPN transistor 42 is formed, in the second island region 50 a vertical PNP transistor 43 is formed, and in the third island region 51 a photodiode 44 is formed. In what follows, the respective structures will be explained.

Firstly, the NPN transistor 42 formed in the first island region 49 will be explained. As shown in FIG. 7, as a structure thereof, an N-type buried layer 56 is formed so as to sandwich a boundary between the first epitaxial layer 46 and the second epitaxial layer 47. In the second epitaxial layer 47, an N-type diffusion region 57 is formed. The diffusion region 57 is overlapped with the N-type buried layer 56 at the depth thereof. In the N-type diffusion region 57, an N-type diffusion region 58 as a collector region and a P-type diffusion region 59 as a base region are formed.

To the P-type diffusion region 59, as an emitter region, an N-type seepage region 60 is formed, and in the N-type diffusion region 58 as a collector extraction region an N-type seepage region 61 is formed.

In the embodiment, with polysilicon to which an N-type impurity is ion-planted, a collector extraction electrode 62 and an emitter extraction electrode 63 are formed. As described above, owing to the seepage of the N-type impurity ion-planted in the polysilicon, an N-type collector extraction region and an emitter region are formed. On a top surface of the collector extraction electrode 62 and the emitter extraction electrode 63, a BPSG film is formed. Through a contact hole formed in the BPSG film, a collector electrode 64, a base electrode 65 and an emitter electrode 66 are formed.

Subsequently, the vertical PNP transistor 43 that is formed in the second island region 50 will be explained. As shown in FIG. 7, as a structure thereof, a P-type buried layer 67 is formed so as to sandwich a boundary between the first epitaxial layer 46 and the second epitaxial layer 47. Furthermore, in the region, an N-type buried layer 68 is formed overlapped with the P-type buried layer 67. In the second epitaxial layer 47, a P-type diffusion region 69 is formed so as to overlap with the P-type buried layer 67 at the depth thereof. In the P-type diffusion region 69, a P-type diffusion region 70 is formed as a collector region. Furthermore, an N-type diffusion region 71 is formed as a base region.

In the N-type diffusion region 71, a P-type seepage region 72 is formed as an emitter region and also an N-type diffusion region 73 is formed as a base extraction region. On the other hand, in the P-type diffusion region 70, a P-type seepage region 74 is formed as a collector extraction region.

In the embodiment, with polysilicon in which a P-type impurity is ion-planted, a collector extraction electrode 75 and an emitter extraction electrode 83 are formed. As described above, owing to the seepage of the P-type impurity that is ion-planted in the polysilicon, the P-type collector extraction region and the emitter region are formed. On top surfaces of the collector extraction electrode 75 and the emitter extraction electrode 83, a BPSG film is formed. Through contact holes formed in the BPSG film, a collector electrode 76, an emitter electrode 77 and a base electrode 78 are formed.

In an optical semiconductor integrated circuit device according to the embodiment, so as to surround a region that forms the vertical PNP transistor 43, an N-type diffusion region 79 is formed. Specifically, the N-type diffusion region 79 is formed more inside of the isolation region 48. That is, on a side of a collector region, an N-type wall is disposed between the P-type diffusion region 70 and the P-type third isolation region 54. Thereby, a surface of the second epitaxial layer 47 between both is reversed to the P-conductivity type and thereby both can be inhibited from short-circuiting. As a result, that a vertical PNP transistor 43 is formed with in epitaxial layers 46 and 47 that are laminated without doping can be realized. The structure will be explained below. Though not shown in the FIG. 7, a VCC potential is applied to the N-type diffusion region 79. Accordingly, the vertical PNP transistor 43, being surrounded by the N-type diffusion region 79 to which VCC potential is applied, can suppress the parasite effect from occurring.

As mentioned above, the vertical PNP transistor 43 is formed in the first and second epitaxial layers 46 and 47 that are laminated without doping. In the first and second epitaxial layers 46 and 47, the P-type diffusion region 69 and the N-type diffusion region 71 are formed, and thereby a formation region of the vertical PNP transistor 43 is secured. Accordingly, when the N-type diffusion region 79 is not formed, only an intrinsic layer is present between, for instance, the P-type diffusion region 69 or 70 and the P-type isolation region 48. Though not shown in the FIG. 7, on a top surface of the LOCOS oxide film 55, for instance, an Al wiring and so on are formed.

In this case, when a current is flowed to the above wiring, a surface of the second epitaxial layer 47 that is high in the resistivity is reversed to a P-type region. As a result, the P-type diffusion region 69 or 70 and the P-type isolation region 48 are short-circuited. At this time, since the second epitaxial layer 47 is non-doped and high in the resistivity, when a voltage of substantially 1 to 2 V is applied to the wiring layer for instance, a surface is reversed to a P-type region. That is, the vertical PNP transistor 43 becomes a structure very poor in the voltage resistance characteristics.

However, in the vertical PNP transistor 43 according to the embodiment, in the second epitaxial layer 47, in the intrinsic layer between the P-type diffusion region 69 or 70 and the P-type isolation region 48, an N-type diffusion region 79 is formed. Accordingly, even when between these two a PN junction region is formed and a surface of the intrinsic layer is altered to a P-type region, the two are not short-circuited. That is, when inside of the P-type isolation region 48 the N-type diffusion region 79 is completely annularly formed, the voltage resistance characteristics of the vertical PNP transistor 43 can be largely improved. Here, the N-type diffusion region 79 is not necessarily formed into a complete annularity but may have a structure in which it is formed only in a region that can improve the voltage resistance characteristics of the vertical PNP transistor 43. The vertical PNP transistor 43 is formed in a region that is surrounded with a substantially N-type diffusion region 79. Also in a horizontal PNP transistor, the above-described structure can be utilized; however, in this case, the N-type diffusion region 79 is utilized where a VCC potential is not applied. Thus, a similar effect as that of the vertical PNP transistor 43 can be obtained.

Furthermore, in the vertical PNP transistor 43 according to the embodiment, the N-type diffusion region 79 can be formed simultaneously with the formation of the N-type diffusion region 57 or 58 of the NPN transistor 42. Accordingly, in the embodiment, since the N-type diffusion regions of the NPN transistor 42 and the vertical PNP transistor 43 can be formed in a common process, a manufacturing method can be simplified.

In the embodiment, when the N-type diffusion region 79 of the vertical PNP transistor 43 and the N-type diffusion region 58 of the NPN transistor 42 are formed in a common process, a distance between the N-type diffusion region 79 and the third P-type diffusion region 54 is, for instance, substantially 12.5 μm. On the other hand, when the N-type diffusion region 79 of the vertical PNP transistor 43 and the N-type diffusion region 57 of the NPN transistor 42 are formed in a common process, a distance between the N-type diffusion region 79 and the third P-type diffusion region 54 is, for instance, substantially 6.2 μm.

That is, the N-type diffusion region 79 of the vertical PNP transistor 43 can be formed in a process common with either one of the N-type diffusion region 57 or 58 of the NPN transistor 42. However, the N-type diffusion region 57 is lower in an impurity concentration and also shallower in the diffusion depth than the N-type diffusion region 58. Accordingly, when the N-type diffusion region 79 is made with a common process with the N-type diffusion region 57, more miniaturization of an element can be realized.

In the next place, a photodiode 44 that is formed in the third island region 51 will be explained. As shown in FIG. 7, as a structure thereof, on a surface of the second epitaxial layer 47, an N-type diffusion region 80 is formed over a substantially entire surface thereof. As mentioned above, the first and second epitaxial layers 46 and 47 are formed without doping and an N-type diffusion region 80 is used as a cathode region. Though not shown in the FIG. 7, to the N-type diffusion region 80, a cathode electrode is connected. On the other hand, a substrate 45 is a P-type single crystal silicon substrate and is linked to a P-type isolation region 48. Though not shown in the FIG. 7, on a surface of the isolation region 48 an anode electrode is formed and the substrate 45 is used as an anode region. The isolation region 48 works as an anode extraction region.

An operation of a photodiode 44 is explained as below. For instance, a VCC potential such as +5 V is applied to the cathode electrode of the photodiode 44 and a GND potential is applied to the anode electrode. Thereby, the photodiode 44 is made in a reverse-biased state. At this time, in the photodiode 44, as described above, the first and second epitaxial layers 46 and 47 are formed without doping. Accordingly, in the embodiment, a depleted layer formation region wider in the width can be secured. That is, a substantially entire region of the first and second epitaxial layers 46 and 47 that are formed non-doped can be made a depleted layer formation region.

Thereby, in the photodiode 44 according to the embodiment, owing to the non-doped first and second epitaxial layers 46 and 47, PN junction capacitance can be reduced and thereby a depleted layer can be expanded. Since when the photodiode 44 is in a reverse-biased state the depleted layer can be formed larger, the drift speed of carriers generated by the incidence of light can be improved. As a result, the high-speed response of the photodiode 44 can be realized.

That is, in the photodiode 44, though depending on an object and usage such as an wavelength of light and so on, when an epitaxial layer that is formed without doping is laminated in multi-layer and thereby a depleted layer formation region can be secured more, the characteristics of the photodiode 44 can be more improved.

In the embodiment, on an insulating layer formed on a top surface of each of elements, a BPSG film, a TEOS film, an SOG film and a wiring layer are formed, resulting in a structure similar to the FIG. 1. Accordingly, explanations of structures of top surfaces of the respective elements should be referred to that in FIG. 1 and omitted here.

As mentioned above, in the embodiment shown in FIG. 7, a non-doped epitaxial layer has a two-layered structure; however, there is no need of particularly restricting to the structure. Even when non-doped epitaxial layer is laminated in a multi-layered structure in accordance with applications of a photodiode, a similar effect can be obtained. Other than that, within a range that does not deviate from a gist of the embodiment of the present invention, various modifications can be applied.

What is claimed is:

1. A manufacturing method of an optical semiconductor integrated circuit device comprising a photodiode, comprising:

providing a semiconductor substrate;

forming a semiconductor layer comprising at least one layer of an epitaxial layer on the semiconductor substrate;

forming a silicon nitride film on the semiconductor layer so as to cover a formation region of the photodiode;

forming a barrier metal layer on the silicon nitride film;

forming an insulating layer on the barrier metal layer;

etching the insulating layer located at the formation region of the photodiode; and removing the barrier metal layer so as to expose the silicon nitride film located at the formation region of the photodiode.

2. The manufacturing method of claim 1, wherein the etching of the insulating layer comprises dry etching the insulating layer using the barrier metal layer as an etching stopper.

3. The manufacturing method of claim 2, wherein when the removing of the barrier metal layer comprises wet etching the barrier metal layer using the silicon nitride layer as an etching stopper.

4. The manufacturing method of claim 1, 2 or 3, further comprising forming a first wiring layer when the barrier metal layer is formed.

5. The manufacturing method of claim 4, wherein the forming of the insulating layer comprises forming a multi-layered wiring layer within the insulating layer.

6. The manufacturing method of claim 1, where the insulating layer is etched so as to form a hole standing on the formation region of the photodiode.

* * * * *